(12) United States Patent
Mariani et al.

(10) Patent No.: US 12,463,163 B2
(45) Date of Patent: Nov. 4, 2025

(54) INTEGRATED CIRCUIT CHIP INCLUDING A PASSIVATION NITRIDE LAYER IN CONTACT WITH A HIGH VOLTAGE BONDING PAD AND METHOD OF MAKING

(71) Applicant: STMicroelectronics S.r.l., Agrate Brianza (IT)

(72) Inventors: Simone Dario Mariani, Vedano al Lambro (IT); Elisabetta Pizzi, Milan (IT); Daria Doria, Como (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/544,747

(22) Filed: Dec. 19, 2023

(65) Prior Publication Data

US 2024/0120301 A1 Apr. 11, 2024

Related U.S. Application Data

(62) Division of application No. 17/391,192, filed on Aug. 2, 2021, now Pat. No. 11,887,948.

(51) Int. Cl.
*H01L 21/56* (2006.01)
*H01L 23/00* (2006.01)

(52) U.S. Cl.
CPC ............ *H01L 24/05* (2013.01); *H01L 21/56* (2013.01); *H01L 24/03* (2013.01); *H01L 24/13* (2013.01); *H01L 24/45* (2013.01); *H01L 2224/02181* (2013.01); *H01L 2224/0219* (2013.01); *H01L 2224/03019* (2013.01);
(Continued)

(58) Field of Classification Search
CPC ........... H01L 21/56; H01L 2224/02181; H01L 2224/0219
See application file for complete search history.

(56) References Cited

U.S. PATENT DOCUMENTS 6,709,965 B1 3/2004 Chen et al.
7,863,742 B2 1/2011 Yu et al.
(Continued)

FOREIGN PATENT DOCUMENTS

CN 103887287 A 6/2014
CN 218498062 U 2/2023

OTHER PUBLICATIONS

EP Search Report and Written Opinion for priority application, EP 22188099.0, report dated Feb. 2, 2023, 12 pgs.
(Continued)

*Primary Examiner* — Dale E Page
*Assistant Examiner* — Wilner Jean Baptiste
(74) *Attorney, Agent, or Firm* — Crowe & Dunlevy LLC

(57) ABSTRACT

A back end of line (BEOL) structure for an integrated circuit chip includes a last metal structure providing a bonding pad. A passivation structure over the bonding pad includes a first opening extending exposing an upper surface of the bonding pad. A conformal nitride layer extends over the passivation structure and is placed in contact with the upper surface of the bonding pad. An insulator material layer covers the conformal nitride layer and includes a second opening that extends through both the insulator material layer and the conformal nitride layer. A foot portion of the conformal nitride layer on the upper surface of the bonding pad is self-aligned with the second opening.

18 Claims, 6 Drawing Sheets

(52) U.S. Cl.
CPC ............... *H01L 2224/0382* (2013.01); *H01L 2224/05582* (2013.01); *H01L 2224/05624* (2013.01); *H01L 2224/05647* (2013.01)

(56) References Cited

U.S. PATENT DOCUMENTS

| | | |
|---|---|---|
| 9,082,761 B2 | 7/2015 | Chuang et al. |
| 9,245,833 B2 | 1/2016 | Chen et al. |
| 10,199,342 B2 | 2/2019 | Zhan et al. |
| 10,236,265 B2 | 3/2019 | Kramp et al. |
| 10,438,909 B2 | 10/2019 | Lee et al. |
| 2012/0211760 A1* | 8/2012 | Yamada ............. H10D 30/4755 257/E21.403 |
| 2015/0187714 A1 | 7/2015 | Bhatkar et al. |
| 2018/0211927 A1* | 7/2018 | Zhan .................... H01L 23/522 |
| 2020/0105634 A1 | 4/2020 | Huang et al. |
| 2021/0043592 A1 | 2/2021 | Park et al. |
| 2021/0098359 A1* | 4/2021 | Vreeland ............... H01L 23/528 |
| 2021/0134742 A1 | 5/2021 | Chockalingam et al. |

OTHER PUBLICATIONS

CN First Office Action 1 and Search Report for counterpart CN Appl. No. 202210915888.6, report dated Aug. 2, 2025, 8 pgs.

* cited by examiner

US 12,463,163 B2

INTEGRATED CIRCUIT CHIP INCLUDING A PASSIVATION NITRIDE LAYER IN CONTACT WITH A HIGH VOLTAGE BONDING PAD AND METHOD OF MAKING

CROSS REFERENCE TO RELATED APPLICATIONS

This application is a divisional of United States Application for patent Ser. No. 17/391,192, filed Aug. 2, 2021, the disclosure of which is hereby incorporated by reference.

TECHNICAL FIELD

Embodiments relate to an integrated circuit chip and, in particular, to an architecture for a high voltage bonding pad that utilizes a passivation nitride layer in contact with the pad and self-aligned to a photosensitive insulator.

BACKGROUND

It is known in the art for an integrated circuit chip to include a high voltage integrated passive component, such as an inductor or capacitor, in the metallization layers which extend over the semiconductor substrate where the active integrated circuit components, such as transistors, are fabricated. A terminal of this passive component may be electrically connected to a high voltage metal bonding pad of the integrated circuit chip. Those skilled in the art recognize that there is a significant reliability advantage if the passivation nitride layer is placed in contact with (i.e., physically connected to) the high voltage metal bonding pad. The current state of the art for making this physical connection is to utilize a construction in the back end of line (BEOL) processing referred to in the art as Nickel-Palladium finishing. However, Nickel-Palladium finishing is not always available in the technology platform. When Nickel-Palladium finishing is not available, the alternative known to those skilled in the art is to utilize a dedicated processing mask in the back end finishing process in order to make the connection between the passivation nitride layer and the metal bonding pad. This solution adds an extra cost to the integrated circuit fabrication.

There is accordingly a need in the art for a BEOL process that supports the making of a physical connection between the passivation nitride layer and the high voltage metal bonding pad without requiring either specialized Nickel-Palladium finishing or a dedicated processing mask.

SUMMARY

In an embodiment, an integrated circuit chip comprises: a front end of line (FEOL) structure and a back end of line (BEOL) structure over the FEOL structure. The BEOL structure includes: a last metal structure providing a bonding pad; a passivation structure covering a peripheral region of the last metal structure and including a first opening extending through the passivation structure and exposing an upper surface of the last metal structure; a conformal nitride layer extending over the passivation structure and in contact with the upper surface of the last metal structure; and an insulator material layer covering the conformal nitride layer and including a second opening extending through both the insulator material layer and the conformal nitride layer, where a foot portion of the conformal nitride layer on the upper surface of the last metal structure is self-aligned with the second opening.

In an embodiment, a method comprises: depositing a passivation layer over a last metal structure providing a bonding pad; forming a first opening extending through the passivation layer to define a passivation structure and expose an upper surface of the last metal structure; conformally depositing a nitride layer extending over the passivation structure and in contact with the upper surface of the last metal structure; coating the nitride layer with an insulator material layer; forming a second opening extending through the insulator material layer; and using the insulator material layer with the second opening as a mask to etch through the nitride layer and expose the upper surface of the last metal structure, where a foot portion of the nitride layer on the upper surface of the last metal structure is self-aligned with the second opening.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
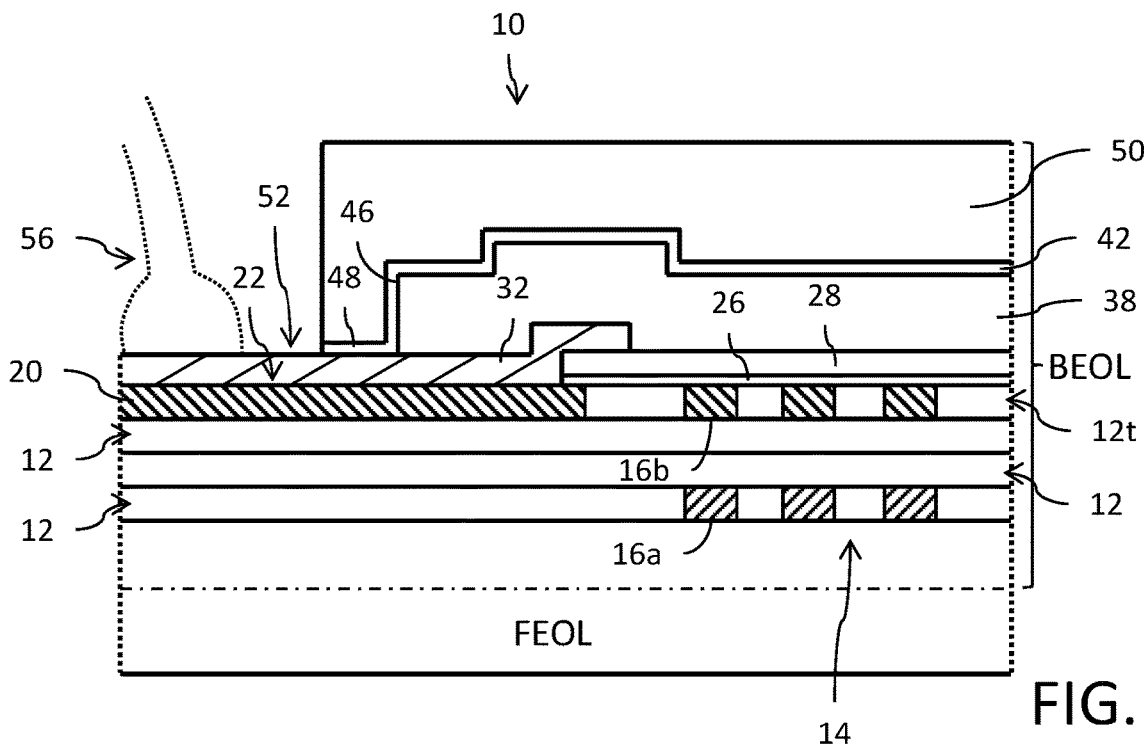
FIG. 1 shows a cross section of an integrated circuit chip.

Reference is made to FIG. 1 which shows a cross-section of an integrated circuit chip 10 including a front end of line (FEOL) structure and a back end of line (BEOL) structure. The front end of line (FEOL) structure includes, for example, a semiconductor substrate, active integrated circuits (transistors, diodes, etc.), metal contacts, and a pre-metallization dielectric (PMD) layer, as known to those skilled in the art. The BEOL structure is formed over the FEOL structure and includes an interconnect comprising a plurality of metallization layers 12, with the layers 12 including metal structures such as connection lines and vias supported in an insulating material. In an embodiment, the metal structures of the layers are formed by Copper and the insulating material is Silicon oxide. The integrated circuit chip 10 further includes a high voltage passive circuit component 14 formed in one or more of the plurality of metallization layers. As an example, FIG. 1 shows a transformer for the passive circuit component 14 which is formed by metal structures on two separate layers 12 to provide a pair of spiral wound inductors 16a, 16b. Alternatively, the passive circuit component 14 could comprise a capacitor. The metal structures in the upper-most (or top) layer 12t of the BEOL structure further include a metal pad 20. Although not explicitly shown, the metal pad 20 is electrically coupled (preferably directly connected) by a connection line in the upper-most layer 12t to a terminal of the high voltage passive circuit component 14 (for example, to an end of the spiral wound inductor 16b).

A top surface of the metal pad 20 and top surface of the insulating material of the upper-most layer 12t present a coplanar top surface 22 of the interconnect. A stack of insulating layers, comprising a Silicon nitride layer 26 and Silicon oxide layer 28, for example, rests on that coplanar surface 22. An opening in the stack of insulating layers exposes a portion of the top surface of the metal pad 20. A metal cap finishing structure 32 (e.g., a bonding pad and/or a redistribution layer (RDL)) is provided within the opening and in contact with the top surface of the metal pad 20. This metal cap finishing structure 32 further extends outside the opening on an upper surface of the stack of insulating layers. In an embodiment, the metal cap finishing structure 32 is made of Aluminum.

A passivation structure extends conformally over the plurality of metallization layers 12, the stack of insulating layers and the metal cap finishing structure 32. This passivation structure comprises at least one insulating layer 38. In a preferred embodiment, the insulating layer 38 is made of Silicon oxide. An opening in the passivation structure provided by the insulating layer 38 exposes a portion of the top surface of the metal cap finishing structure 32.

A nitride layer 42 extends conformally over the passivation insulating layer 38. Because of the presence of the opening in the passivation insulating layer 38, the layer 42 extends on a sidewall 46 of the layer 38 at the opening and further extends on (and in contact with) the top surface of the metal-cap finishing structure 32. The portion of layer 42 extending on the top surface of the metal cap finishing structure 32 is referred to as the foot 48 of the nitride layer, and it is this connection of the nitride layer 42 at the foot 48 to the high voltage bonding pad (metal cap finishing structure 32) that presents the significant reliability advantage noted above.

A photosensitive insulator layer 50 is provided over the Nitride layer 42. The material of the layer 50 is, for example, a carbon-based polymer that is used as a protection layer for the integrated circuit. This polymer comprises a photoresist that is lithographically defined and temperature cured to a stable physical and chemical configuration. The lithographic definition forms an opening which exposes a top surface of the Nitride layer 42. This opening is further used as a mask opening to define through an etching process the physical extent of the foot 48 self-aligned with the photosensitive insulator layer 50. As a result of that etching, layer 42 includes an opening which exposes the upper surface of the metal cap finishing structure 32. A ball bond or wire bond 56 may then be made to the metal cap finishing structure 32 at this exposed upper surface.

Reference is now made to FIGS. 2 to 8 which show steps in the back end of line (BEOL) process to make the structure shown in FIG. 1.

Figure 2:
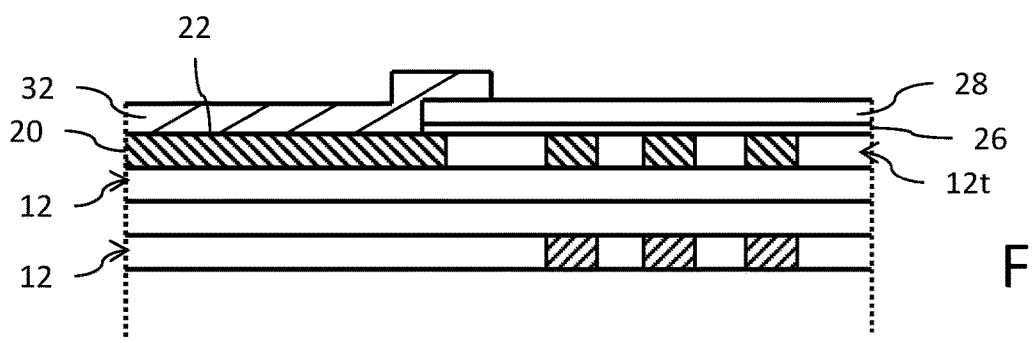
FIGS. 2 to 8 show steps in the back end of line (BEOL) process to make the structure shown in FIG. 1.

FIG. 2 illustrates the structure following completion of a standard process flow in the BEOL process up to the point where definition of the metal cap finishing structure 32 has been completed. As part of this standard process flow, after deposition of the stack of insulating layers (Silicon nitride layer 26 and Silicon oxide layer 28) on the coplanar surface 22, a lithographic patterning using tools and processes well known in the art is performed to form an opening that exposes to the top surface of a portion of the metal pad 20 in the upper-most metallization layer 12t. The Aluminum material for the metal cap finishing structure 32 is then conformally (blanket) deposited in a layer which fills the opening and extends over the top surface of the stack. A lithographic patterning process is then performed to remove unwanted portions of the Aluminum material layer and define the size and extent of the metal cap finishing structure 32.

Figure 3:
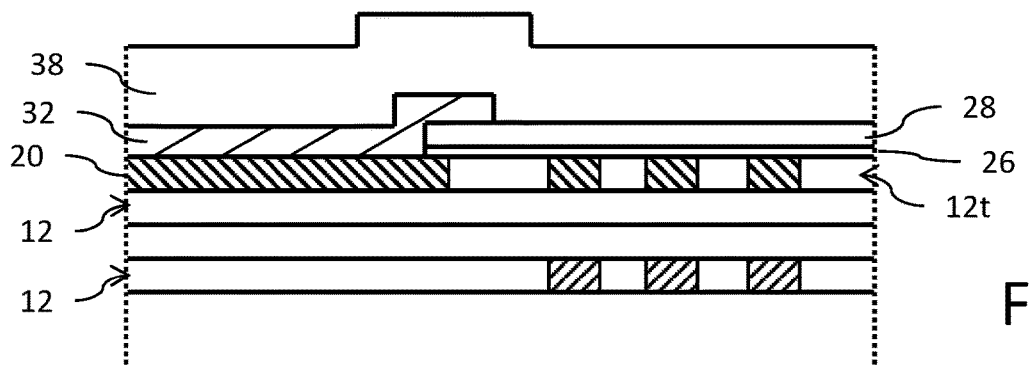

Next, a conformal (blanket) deposition of a passivation oxide material layer 38 is made. The material used for layer 38 may, for example, be a Silicon oxide. The result is shown in FIG. 3.

Figure 4:
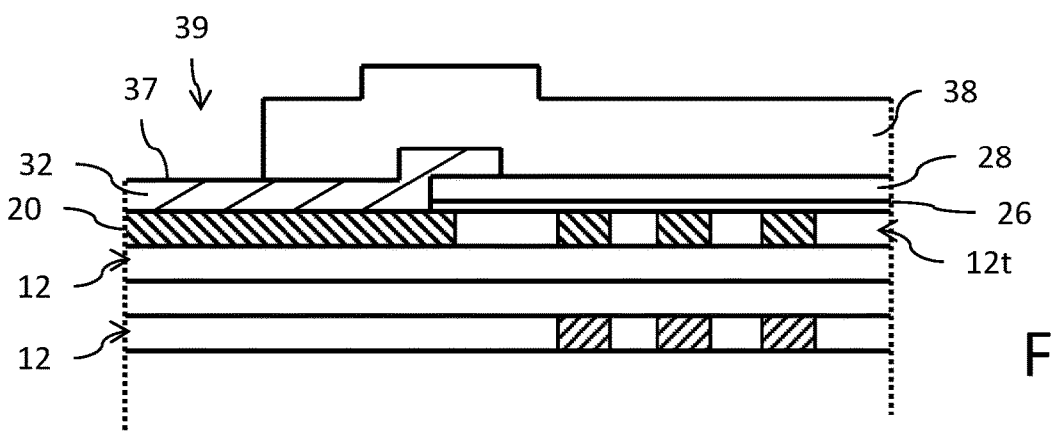

The passivation oxide layer 38 is then lithographically patterned to form an opening 39 exposing a portion 37 of the top surface of the metal cap finishing structure 32 and define a passivation structure. The result is shown in FIG. 4.

Figure 5:
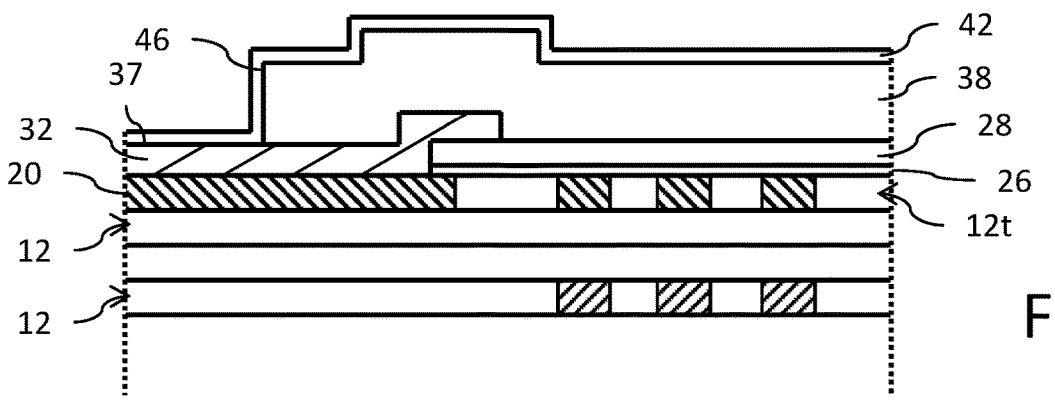
Figure 6:
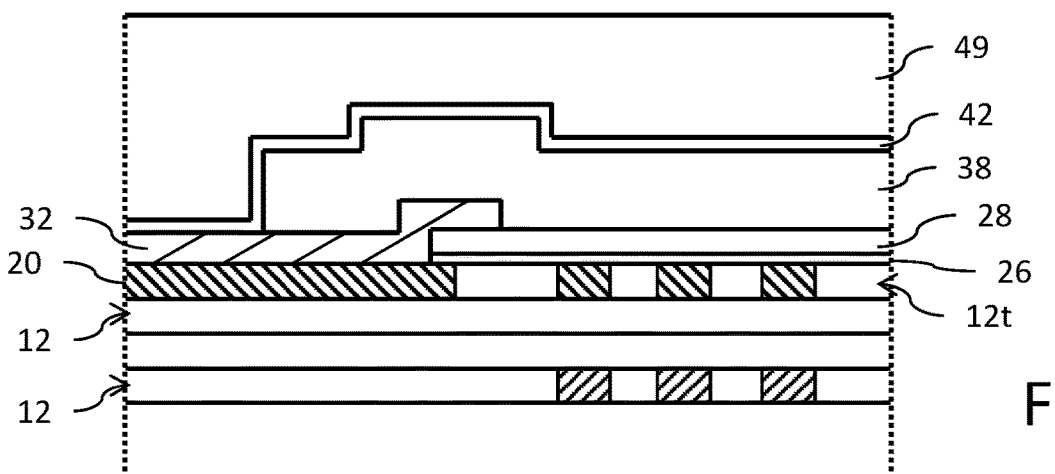

In FIG. 5, a nitride layer 42 is conformally (blanket) deposited over the passivation insulating layer 38. The layer 42 extends along the sidewall 46 of the opening 39 and further covers (contacts) the exposed portion 37 of the top surface of the metal cap finishing structure 32. The material used for layer 42 may, for example, be a Silicon nitride.

A photosensitive insulator material is coated on the layer 42. For example, a spin-coating process can be used to produce a layer 49 of the photosensitive insulator material in the form of a photoresist. See, FIG. 6. The photosensitive insulator material may, for example, be a carbon-based polymer resist.

Figure 7:
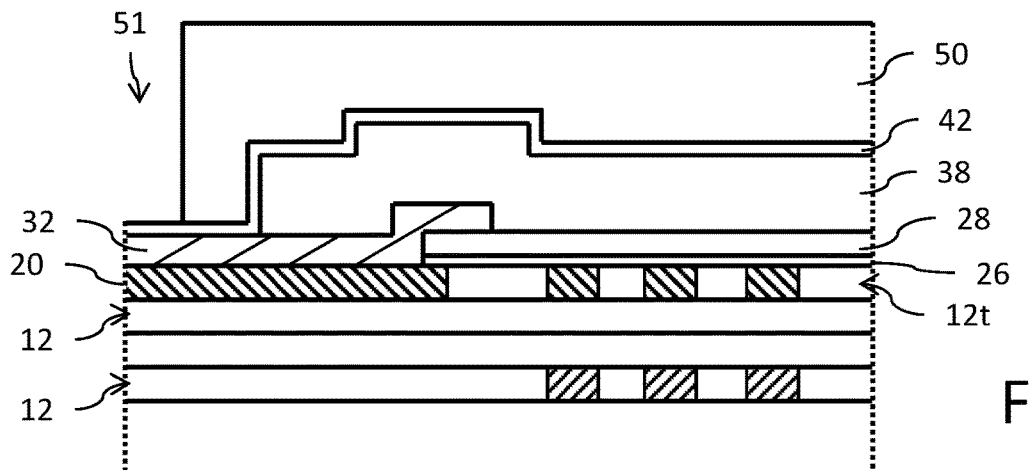

The photoresist layer 49 is then lithographically defined and temperature cured. As a result, the layer 49 forms a photosensitive insulator layer 50 with a mask opening 51. The result is shown in FIG. 7.

Figure 8:
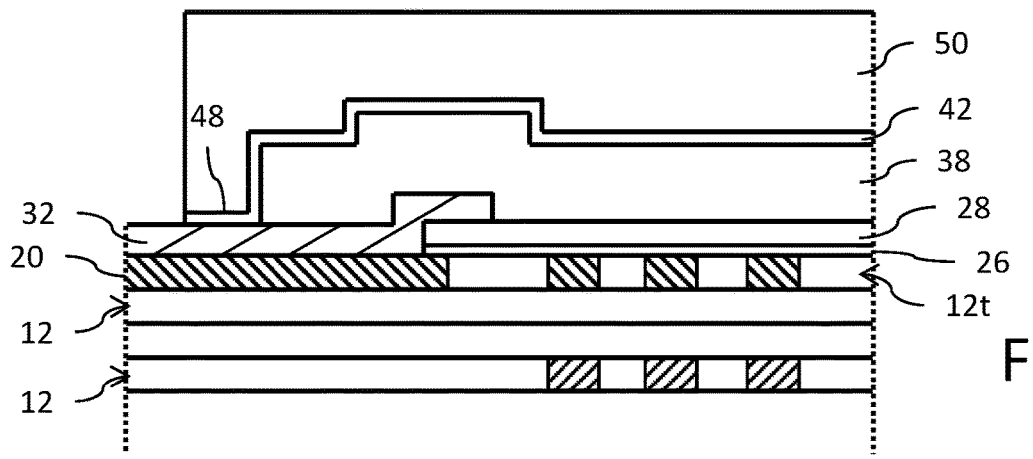

An etching is then performed using the photosensitive insulator layer 50 as a mask. The etching removes a portion of the layer 42 located in the mask opening 51 to expose the top surface of the metal cap finishing structure 32. This etching through the layer 42 further defines the extent of the foot 48 of the Nitride layer 42 so that it is self-aligned to the opening in the photosensitive insulator layer 50 while remaining in contact with the top surface of the metal cap finishing structure 32. The result is shown in FIG. 8. The advantage presented by the fabrication process as described above is that no additional dedicated mask for patterning the Nitride layer 42 (and foot 48) is needed. Rather, the fabrication process takes advantage of the masking used in connection with defining the opening in the photosensitive insulator layer 50 to self-align the foot 48 of the Nitride layer 42.

Figure 9:
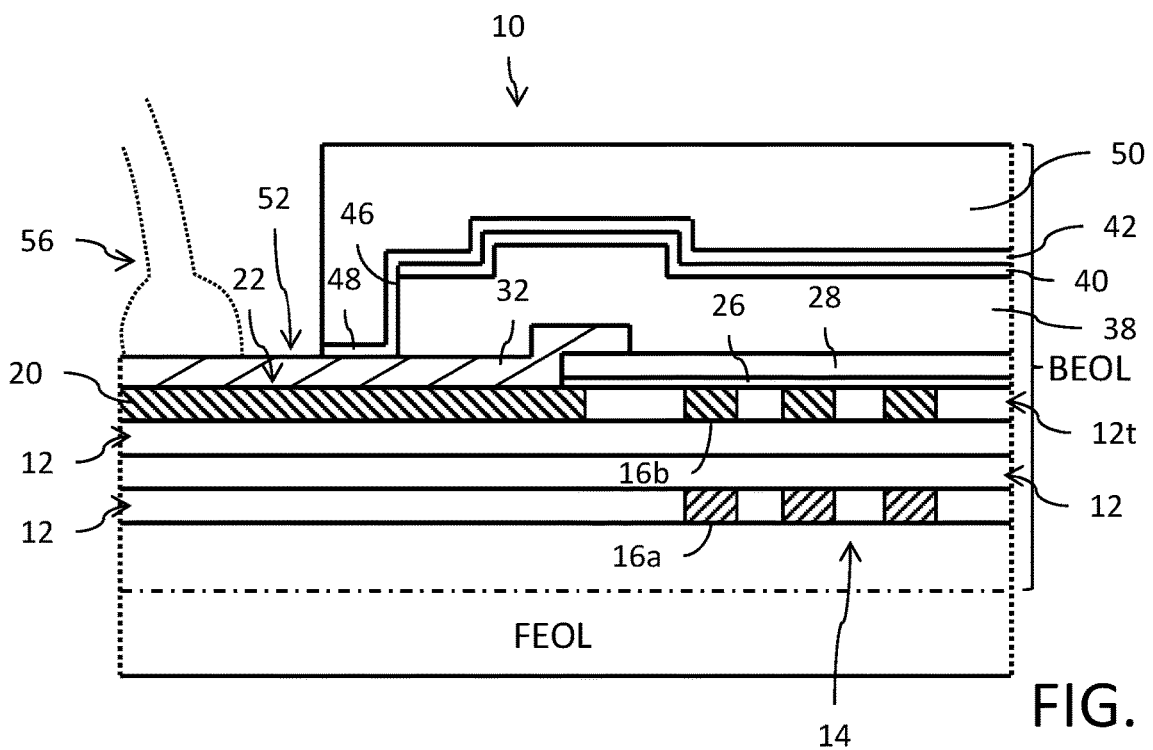
FIG. 9 shows a cross section of an alternative embodiment of an integrated circuit chip.

Reference is made to FIG. 9 which shows a cross-section of an alternative embodiment of the integrated circuit chip 10. Like references in FIGS. 1 and 9 refer to like or similar components. The chip 10 of FIG. 9 differs from the chip 10 of FIG. 1 in that the passivation structure includes a nitride layer 40 in addition to the oxide layer 38. The opening in the passivation structure accordingly extends through both passivation layers (nitride and oxide).

FIGS. 10 to 16 show steps in the back end of line (BEOL) process to make the structure shown in FIG. 9.

Figure 10:
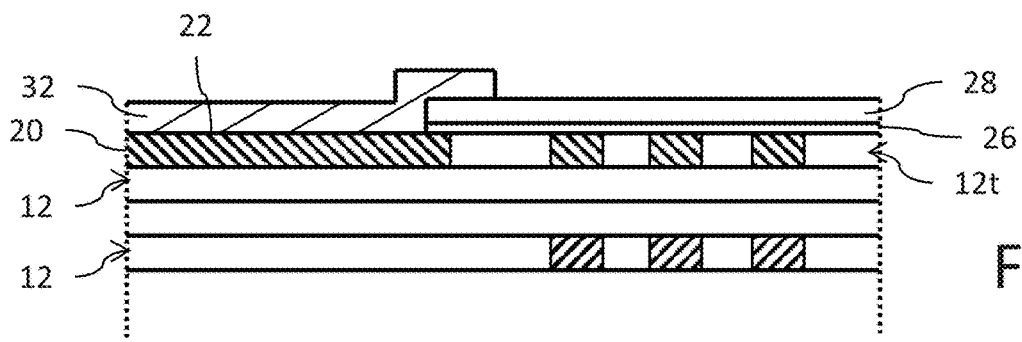
FIGS. 10 to 16 show steps in the BEOL process to make the structure shown in FIG. 9.

FIG. 10 corresponds to FIG. 2 and for the sake of brevity will not be described again.

Figure 11:
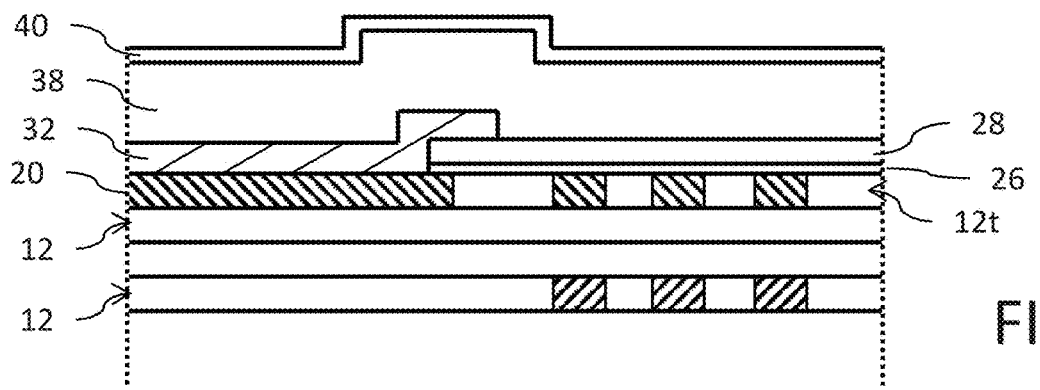

Next, a conformal (blanket) deposition of a stack of passivation layers is made. The stack includes a passivation oxide material layer 38 and a passivation nitride material layer 40. The material used for layer 38 may, for example, be a Silicon oxide, and the material used for layer 40 may, for example, be a Silicon nitride. The result is shown in FIG. 11.

Figure 12:
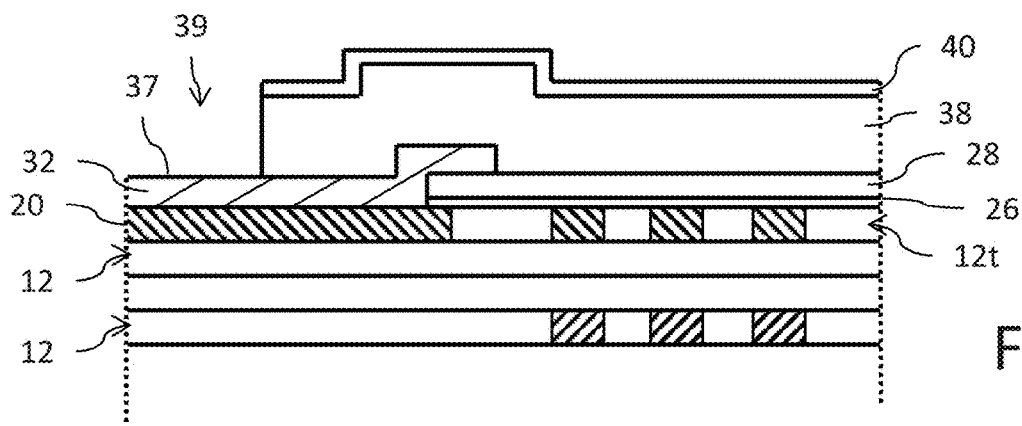

The stack of passivation layers is then lithographically patterned to form an opening 39 exposing a portion 37 of the top surface of the metal cap finishing structure 32 and define a passivation structure. The result is shown in FIG. 12.

Figure 13:
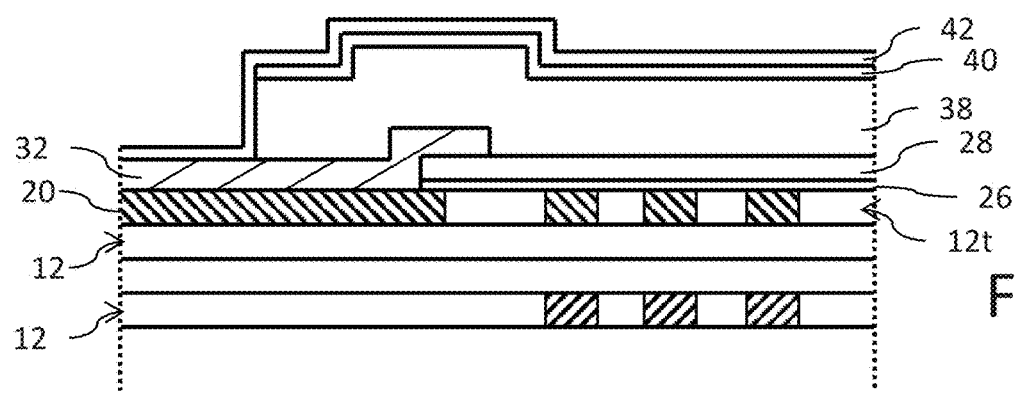
Figure 14:
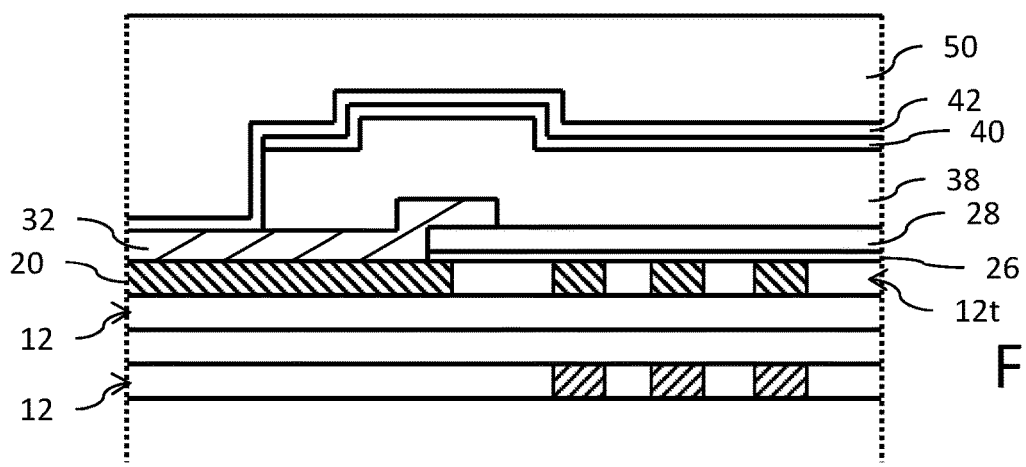

In FIG. 13, a further nitride layer 42 is conformally (blanket) deposited over the passivation structure (patterned insulating layers 38 and 40). The layer 42 extends along the sidewall 46 of the opening 39 and further covers (contacts) the exposed portion 37 of the top surface of the metal cap finishing structure 32. The material used for layer 42 may, for example, be a Silicon nitride.

A photosensitive insulator material is coated on the layer 42. For example, a spin-coating process can be used to produce a layer 49 of the photosensitive insulator material in the form of a photoresist. See, FIG. 14. The photosensitive insulator material may, for example, be a carbon-based polymer resist.

Figure 15:
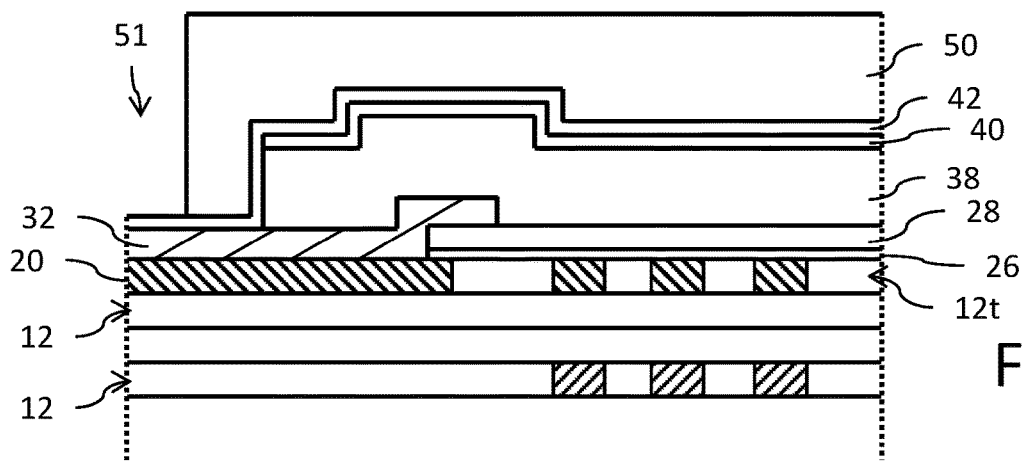

The photoresist layer 49 is then lithographically defined and temperature cured. As a result, the layer 49 forms a photosensitive insulator layer 50 with a mask opening 51. The result is shown in FIG. 15.

Figure 16:
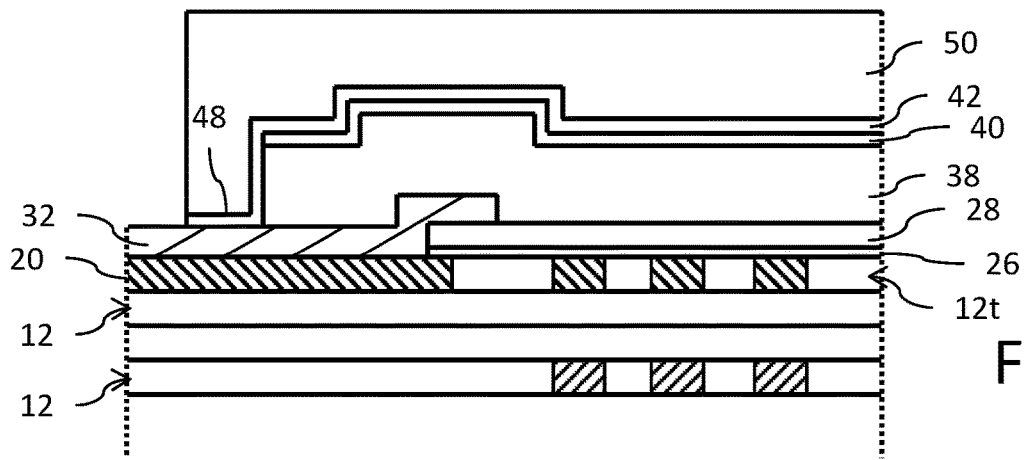

An etching is then performed using the photosensitive insulator layer 50 as a mask. The etching removes a portion of the layer 42 in the mask opening 51 to expose the top surface of the metal cap finishing structure 32. This etching through the layer 42 further defines the extent of the foot 48 of the Nitride layer 42 so that it is self-aligned to the opening in the photosensitive insulator layer 50 while remaining in contact with the top surface of the metal cap finishing structure 32. The result is shown in FIG. 16.

Figure 17:
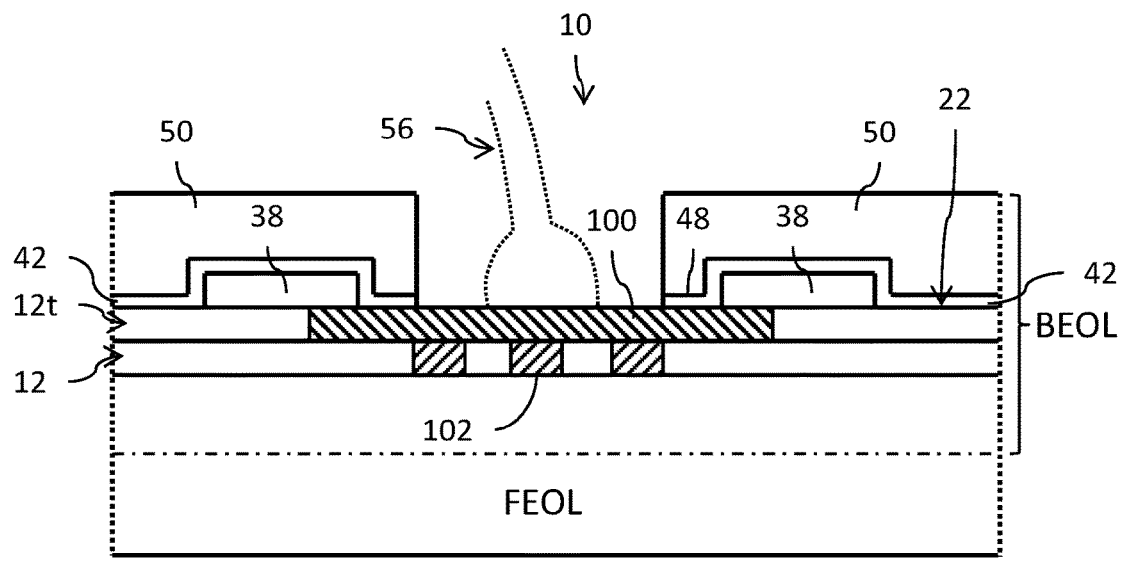
FIGS. 17 and 18 show cross sections of further alternative embodiments of an integrated circuit chip.
Figure 18:
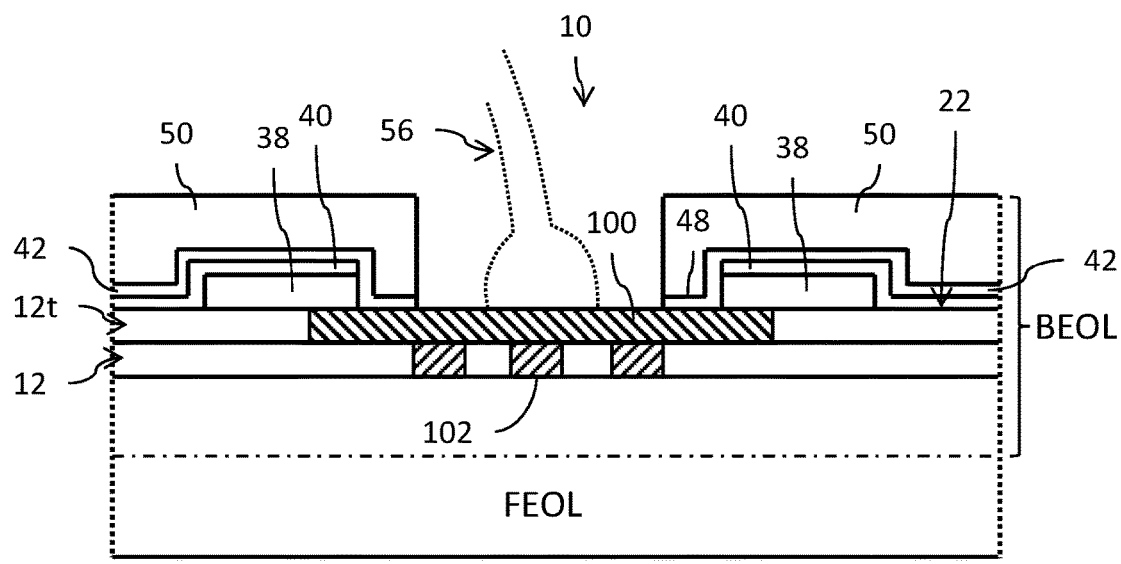

Reference is made to FIGS. 17 and 18 which show cross-sections of alternative embodiments of the integrated circuit chip 10. Like references in FIGS. 1, 9 and 17-18 refer to like or similar components. The Nitride layer 42 with foot 48 self-aligned to the photosensitive insulator material layer 50 can be used in connection with any last metal structure 100 of the integrated circuit chip 10 (for example, as shown, located in the upper-most layer 12t of the interconnect). In this embodiment, the last metal structure 100 may comprise a Copper and/or Aluminum pad in layer 12t with supporting vias 102 in the underlying layer 12. The passivation oxide layer 38 (with or without further nitride layer 40) covers the peripheral region of the last metal structure 100 and the insulating material of the layer 12t. The conformally (blanket) deposited Nitride layer 42 is then patterned using the opening in the photosensitive insulator material layer 50 to access the top surface of the last metal structure 100.

The BEOL process shown in FIGS. 3-8 may be used to make the structures as shown in FIG. 17. Additionally, it will be recognized that the passivation structure could instead comprise both passivation oxide layer 38 and nitride layer 40, as shown in FIG. 18, in which case the BEOL process shown in FIGS. 11-16 may be used to make the structures.

The foregoing description has provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
   depositing a passivation layer over a last metal structure providing a bonding pad;
   wherein the last metal structure comprises:
      a metal pad at an upper-most metallization layer of a back end of line (BEOL) structure; and
      a metal cap finishing structure in contact with an upper surface of the metal pad;
   forming a first opening extending through the passivation layer to define a passivation structure and expose an upper surface of the last metal structure;
   conformally depositing a nitride layer extending over the passivation structure and in contact with the upper surface of the last metal structure;
   coating the nitride layer with an insulator material layer;
   forming a second opening extending through the insulator material layer; and
   using the insulator material layer with the second opening as a mask to etch through the nitride layer and expose the upper surface of the last metal structure, where a foot portion of the nitride layer on the upper surface of the last metal structure is self-aligned with the second opening.

2. The method of claim 1, wherein the passivation layer comprises an oxide layer.

3. The method of claim 1, wherein the passivation layer comprises a stack of an oxide layer and a nitride layer.

4. The method of claim 1, wherein the last metal structure comprises an Aluminum pad.

5. The method of claim 1, wherein the last metal structure comprises a Copper pad.

6. The method of claim 1, further comprising:
   depositing a stack of insulating layers extending over the upper-most metallization layer;
   forming a third opening extending through the stack of insulating layers to expose a portion of the upper surface of the metal pad; and
   forming said metal cap finishing structure to extend over an upper surface of the stack of insulating layers.

7. The method of claim 6, wherein the stack of insulating layers comprises:
   a nitride layer on the top surface of the upper-most metallization layer; and
   an oxide layer on top of the nitride layer.

8. The method of claim 1, further comprising forming the last metal structure within the BEOL structure of an integrated circuit.

9. The method of claim 1, further comprising forming the last metal structure within the upper-most metallization layer of an integrated circuit.

10. The method of claim 1, further comprising:
    forming a passive circuit component within the BEOL structure of an integrated circuit; and
    electrically connecting a terminal of the passive circuit component to the last metal structure.

11. The method of claim 10, wherein the passive circuit component is formed in one or more metallization layers of the BEOL structure.

12. The method of claim 10, wherein the passive circuit component is one of an inductor or a capacitor.

13. A method, comprising:
    forming a bonding pad in an upper-most metallization layer of a back end of line (BEOL) structure;
    forming a last metal structure including a metal cap finishing structure in contact with an upper surface of the bonding pad;
    depositing a passivation layer over the last metal structure;
    forming a first opening extending through the passivation layer to define a passivation structure and exposing an upper surface of a portion of the last metal structure;
    conformally depositing a nitride layer extending over the passivation structure and in contact with the upper surface of the last metal structure;
    coating the nitride layer with an insulator material layer;
    forming a second opening extending through the insulator material layer, wherein the second opening in insulator material layer leaves a portion of the insulating material layer covering a foot portion of the nitride layer in contact with the upper surface of the last metal structure; and using the insulator material layer with the second opening as a mask to etch through the nitride layer and expose a portion of the upper surface of the last metal structure so that the insulator material layer and the foot portion are self-aligned.

14. The method of claim 13, wherein the passivation layer comprises an oxide layer and/or a nitride layer.

15. The method of claim 13, wherein the last metal structure comprises an Aluminum pad or a Copper pad.

16. The method of claim 13, further comprising:
   depositing a stack of insulating layers extending over the upper-most metallization layer;
   forming a third opening extending through the stack of insulating layers to expose a portion of the upper surface of the bonding pad; and
   forming the metal cap finishing structure to extend over an upper surface of the stack of insulating layers.

17. The method of claim 16, wherein the stack of insulating layers comprises:
   a nitride layer on the top surface of the upper-most metallization layer; and
   an oxide layer on top of the nitride layer.

18. The method of claim 13, further comprising forming the last metal structure within the BEOL structure of an integrated circuit.

* * * * *